(12) United States Patent
Watanabe et al.

(10) Patent No.: US 7,548,463 B2
(45) Date of Patent: Jun. 16, 2009

(54) NONVOLATILE SEMICONDUCTOR MEMORY DEVICE AND METHOD OF OPERATING THE SAME WHICH STABLY PERFORM ERASE OPERATION

(75) Inventors: Kazuo Watanabe, Kanagawa (JP); Hiroshi Sugawara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 65 days.

(21) Appl. No.: 11/802,322

(22) Filed: May 22, 2007

(65) Prior Publication Data

US 2007/0279999 A1 Dec. 6, 2007

(30) Foreign Application Priority Data

May 23, 2006 (JP) ............................. 2006-142517

(51) Int. Cl.
*G11C 16/06* (2006.01)

(52) U.S. Cl. ............................. 365/185.23; 365/185.18; 365/185.11; 365/185.12; 365/185.13; 365/185.22; 365/230.06; 365/185.29

(58) Field of Classification Search ............ 365/185.23, 365/185.18, 185.11, 185.12, 185.13, 185.22, 365/185.29, 185.3, 185.33, 230.06
See application file for complete search history.

(56) References Cited

U.S. PATENT DOCUMENTS

| 5,973,963 | A | 10/1999 | Sugawara |
| 6,233,198 | B1 | 5/2001 | Choi |
| 7,254,084 | B2 * | 8/2007 | Terasawa et al. ............ 365/229 |
| 2005/0243602 | A1 | 11/2005 | Umezawa |

FOREIGN PATENT DOCUMENTS

| JP | 10-214495 | 8/1998 |
| JP | 2001-43693 | 2/2001 |
| JP | 2005-317138 | 11/2005 |

* cited by examiner

*Primary Examiner*—Hoai V. Ho
*Assistant Examiner*—Fernando N Hidalgo
(74) *Attorney, Agent, or Firm*—Young & Thompson

(57) ABSTRACT

A nonvolatile semiconductor memory device includes a memory array and an X-decode section. The memory array includes a plurality of nonvolatile memory cells arranged in a matrix form and a plurality of word lines. The X-decode section selects a selected word line selected from the plurality of word lines, supplies a negative voltage to the selected word line, and supplies a positive voltage to unselected word lines which are not the selected word line, at the time of an erase operation.

8 Claims, 9 Drawing Sheets

Fig. 7

| READ (WORD_0 SELECTION) | | VPS | VNS | VXPS | VXNS | VXPS_0 | VXNS_0 | SELPG_0 | SELNG_0 | XP_0 | XP_1 | SEL | ADDR | ER_SEL |
|---|---|---|---|---|---|---|---|---|---|---|---|---|---|---|
| SELECTED SECTOR | WITHIN SELECTED Xmain | 6V | 0V | 6V | 0V | 6V | 0V | 6V | 0V | 0V | 6V | H | H | L |
| | WITHIN UNSELECTED Xmain | → | → | → | → | 0V | → | → | VCC | → | → | H | L | L |
| UNSELECTED SECTOR | | → | → | 0V | → | → | → | → | → | → | → | L | L | L |

Fig. 8

| PROGRAM (WORD_0 SELECTION) | | VPS | VNS | VXPS | VXNS | VXPS_0 | VXNS_0 | SELPG_0 | SELNG_0 | XP_0 | XP_1 | SEL | ADDR | ER_SEL |
|---|---|---|---|---|---|---|---|---|---|---|---|---|---|---|
| SELECTED SECTOR | WITHIN SELECTED Xmain | 10V | 0V | 10V | 0V | 10V | 0V | 10V | 0V | 0V | 10V | H | H | L |
| | WITHIN UNSELECTED Xmain | → | → | → | → | 0V | → | → | VCC | → | → | H | L | L |
| UNSELECTED SECTOR | | → | → | 0V | → | → | → | → | → | → | → | L | L | L |

Fig. 9

| ERASE (WORD_0 SELECTION) | | VPS | VNS | VXPS | VXNS | VXPS_0 | VXNS_0 | SELPG_0 | SELNG_0 | XP_0 | XP_1 | SEL | ADDR | ER_SEL |
|---|---|---|---|---|---|---|---|---|---|---|---|---|---|---|
| SELECTED SELECTOR | WITHIN SELECTED Xmain | VCC | -10V | VCC | -10V | VCC | -10V | VCC | -10V | VCC | -10V | H | H | H |
| | WITHIN UNSELECTED Xmain | → | → | → | → | → | VCC | 0V | → | → | → | H | L | H |
| UNSELECTED SECTOR | | → | → | 0V | 0V | 0V | 0V | VCC | VCC | VCC | → | L | L | L |

NONVOLATILE SEMICONDUCTOR MEMORY DEVICE AND METHOD OF OPERATING THE SAME WHICH STABLY PERFORM ERASE OPERATION

BACKGROUND OF THE INVENTION

1. Field of the Invention

The present invention relates to a nonvolatile semiconductor memory device and a method of operating the nonvolatile semiconductor memory device.

2. Description of Related Art

Nonvolatile semiconductor memory devices, such as flash memories, have been known which perform nonvolatile storage of data. In general, the flash memories perform an erase operation collectively in units of a sector or memory cell array. That is to say, erasing is performed at the erase operation by supplying negative voltage to gates of all memory cells after writing (programming) is performed to those memory cells in a sector to be erased. At this time, there are variations in threshold voltages at the memory cells after the erasing, due to variations in the properties of the memory cells in the sector. For this reason, it is possible that there is a memory cell where over-erasing is caused among the memory cells in the sector. To cope with such possibility, a verify operation is performed after the erase operation. With this erase-verify operation, judgment is made whether an over-erased memory cell is present or not and rewriting (re-programming) is performed to such an over-erased memory cell.

As the related art, a flash memory device is disclosed in Japanese Laid-Open Patent Application JP-P2001-43693A (corresponding to U.S. Pat. No. 6,233,198B1). This memory device is a nonvolatile semiconductor memory device having a hierarchical word line structure. The memory device includes a plurality of sectors, a plurality of global word lines, a global word line selection circuit, a first local decoder, and a second local decoder. The plurality of sectors has memory cells, each of which is connected to the local word line. Each of the plurality of global word lines is arranged through the corresponding sector. The global word line selection circuit has a first global decoder for selecting one word line from odd-numbered global word lines and a second global decoder for selecting one word line from even-numbered global word lines. The first local decoder, which corresponds to each of the odd-numbered global word lines, drives one word line among corresponding local word lines to a word line voltage when a corresponding odd-numbered global word line is selected. The second local decoder, which corresponds to each of the even-numbered global word lines, drives one word line among corresponding local word lines to the word line voltage when a corresponding even-numbered global word line is selected. Each of the first and second local decoders has a plurality of drivers each connected to corresponding local word lines. Each of the drivers is composed of a pull-up transistor for connecting a local word line that corresponds to a signal of a corresponding global word line to a row partial decoder, and a pull-down transistor for connecting the corresponding local word line to a block decoder in accordance with the signal of the corresponding global word line.

Japanese Laid-Open Patent Application JP-A-Heisei 10-214495 (corresponding to U.S. Pat. No. 5,973,963A) discloses a nonvolatile semiconductor memory device. The nonvolatile semiconductor memory device includes an internal power supply generation circuit, a power switching circuit, a memory cell array, and a row decoder circuit section. The internal power supply generation circuit receives a given external voltage and outputs negative voltage and high voltage larger than the given external voltage. The power switching circuit switches one of the high voltage and the negative voltage to another, and outputs it. The memory cell array has a plurality of memory cell transistors capable of electrical erasing and writing arranged in row and column directions in a matrix form. The row decoder circuit section selects one of the word lines of the memory cell array in accordance with an input address, outputs an output that corresponds to the negative voltage or high voltage to the selected word line in accordance with selection modes of erasing or writing, and outputs ground potential to unselected word lines. The row decoder circuit section has a main decoder, a predecoder, and a word line driver. The main decoder in accordance with the input address, outputs ground potential and the external voltage potential from selected first and second output nodes, and outputs the external voltage potential and ground potential when negative voltage is supplied to the selected word line and high voltage potential and ground potential when high voltage is supplied to the selected word line from unselected first and second output nodes. The predecoder outputs negative voltage potential or the external voltage potential from a selected output node and ground potential from an unselected output node in accordance with the input address and selection modes. The word line driver connects the first and second output nodes of the main decoder with the output nodes of the predecoder, and outputs negative voltage potential or the external voltage potential that are in accordance with the selection modes to a selected word line and ground potential to unselected word lines.

Japanese Laid-Open Patent Application JP-P2005-317138A (corresponding to US2005/0243602A1) discloses a nonvolatile semiconductor memory device. The nonvolatile semiconductor memory device has a memory cell, a memory cell array, a bit line, a word line, a latch circuit, a voltage generation circuit, a first row decoder, a second row decoder, a first separatory transistor, and a second separatory transistor. The memory cell includes a memory cell transistor having a floating gate and a control gate. The memory cell array has the memory cells arranged in a matrix form. The bit line is electrically and commonly connected between drains of the memory cell transistors in the same column. The word line is commonly connected between control gates of the memory cell transistors in the same row. The latch circuit is provided in correspondence to the bit line and stores written data. The voltage generation circuit generates negative voltage and positive voltage. The first row decoder is provided for each word line and applies positive voltage generated by the voltage generation circuit to the word line at the time of writing and erasing. The second row decoder is provided for each word line and applies negative voltage generated by the voltage generation circuit to the word line at the time of writing and erasing. The first separatory transistor is provided for each word line and performs switching between the first row decoder and the word line. The second separatory transistor is provided for each word line and performs switching between the second row decoder and the word line.

We have now discovered the following facts.

Variations in threshold voltages at memory cells at the time of erasing as mentioned above have not caused problems so far since the variations are within a given allowable range. However, it is expected with the miniaturization of memory cells that the variations in threshold voltages rise to a level that no longer can be ignored. In that case, for example, there is a possibility that over-erasing is too spread to be coped with by the typical erase-verify operation. For this reason, a technique is desired that can control variations in threshold voltages at memory cells at the time of erasing to stably perform an erase operation, responding to the miniaturization of memory cells.

The study by the inventors of the present invention has revealed that it is preferable to perform an erase operation in units of not a sector but a word line in a sector, as a method of controlling variations in threshold voltages at memory cells at the time of erasing. This makes it possible to narrow distribution of threshold voltages as a result of reduction in the number (population parameter) of memory cells to be erased at one erase operation. In other words, a range of variations in threshold voltages can be kept narrow.

In addition, the following phenomenon may be caused when erasing is performed to a sector collectively. When an over-erased memory cell is present on a bit line, read current is more likely to flow through the over-erased memory cell compared with other memory cells on the bit line. Therefore, when an over-erased memory cell is caused in performing collective erasing to a sector, it is difficult at the time of erase-verify to correctly read data of the other memory cells that share the bit line with the over-erased memory cell. As a result, it is difficult to correctly perform erase-verify.

However, when an erase operation is performed in units of a word line as mentioned above, erasing and erase-verify are performed to each word line after collective writing, or erasing and erase-verify are performed to each word line after writing is performed to each word line. In other words, erasing, erase-verify, and rewriting at least are performed in units of a word line. Consequently, an over-erased memory cell is no longer present on the same bit line. Then, it is possible to prevent the above phenomenon caused in performing collective erasing to a sector.

As explained above, it is effective to perform an erase operation in units of a word line in order to control variations in threshold voltages at memory cells at the time of erasing. However, when a row local decoder with four transistors shown in FIG. 2 of Japanese Laid-Open Patent Application JP-P2001-43693A is used, selecting one word line (selected word line) causes other word lines that are not selected (unselected word line) to be in an open state (floating state), or high impedance state. As a result, the unselected word lines are susceptible to the effect of voltage noise, which may cause false operation.

In addition, Japanese Laid Open Patent Application JP-A-Heisei 10-214495 discloses a structure where desired positive voltage and GND are applied to a selected word line and unselected word lines respectively, by a word line driver circuit 19. In this case, problems have not been posed so far since an erase operation is not performed collectively to a sector. However, when erasing is performed in units of a word line, there is a possibility that erasing is also caused to a memory cell on an unselected word line, which has been revealed by the inventors' study. That is to say, the inventors' study has revealed that erasing can be caused to a memory cell on an unselected word line as well as that on a selected word line by electrons being drawn out by positive voltage, when negative voltage and GND are applied to a selected word line and unselected word lines respectively and the positive voltage is applied as a substrate voltage at the time of erasing. Occurrence of erasing to a memory cell on an unselected word line, which causes over-erasing and so on, is not preferable. It is desired to provide a technique to control variations in threshold voltages at memory cells at the time of erasing more appropriately and precisely without adversely affecting memory cells on word lines other than a selected word line.

Additionally, it is necessary to apply a voltage that is high to a certain degree between a gate of a memory cell and a substrate in order to satisfy erasing speed, when erasing is performed not collectively to a sector but in units of a word line to ultimately complete erasing of a whole sector. In this case, it is not possible to apply a high voltage to only one of the gate and the substrate (e.g. gate voltage is 10 V while substrate voltage is 0 V), considering withstand voltage and so forth of a device itself. Therefore, it is necessary to apply negative voltage as a gate voltage and positive voltage as a substrate voltage (e.g. the gate voltage is −5 V while the substrate voltage is +5 V). In this case, this related art does not make it possible to control variations in erasing distribution, where +5 V voltage is applied to erasing unselected cells.

SUMMARY

In order to achieve an aspect of the present invention, the present invention provides a nonvolatile semiconductor memory device including: a memory array configured to include a plurality of nonvolatile memory cells arranged in a matrix form and a plurality of word lines; and an X-decode section configured to select a selected word line selected from said plurality of word lines, supply a negative voltage to said selected word line, and supply a positive voltage to unselected word lines which are not said selected word line, at the time of an erase operation.

In the present invention, the erase operation is performed in units of a word line. In this case, the erasing is carried out by applying the voltage difference between the substrate voltage (positive voltage) and the negative voltage of the selected word line to the memory cells on the selected word line. On the other hand, the voltage difference between the substrate voltage (positive voltage) and the positive voltage of the unselected word lines is applied to the memory cells on the unselected word lines. Therefore, the voltage difference applied to the memory cells on the unselected word lines can be much smaller than that applied to the memory cells on the selected word line. That is, erasing of the memory cells on the unselected word lines can be avoided. Therefore, it is possible to more appropriately and accurately control variations in threshold voltages at memory cells at the time of erasing without any harmful effect on the memory cells on the unselected word lines.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a table showing an example of a voltage of each signal at the time of a read operation in the nonvolatile semiconductor memory device of the present invention;

FIG. 8 is a table showing an example of a voltage of each signal at the time of a write operation in the nonvolatile semiconductor memory device of the present invention;

FIG. 9 is a table showing an example of a voltage of each signal at the time of an erase operation in the nonvolatile semiconductor memory device of the present invention.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a nonvolatile semiconductor memory device and a method of operating the nonvolatile semiconductor memory device according to the present invention will be described below with reference to the attached drawings.

Figure 1:
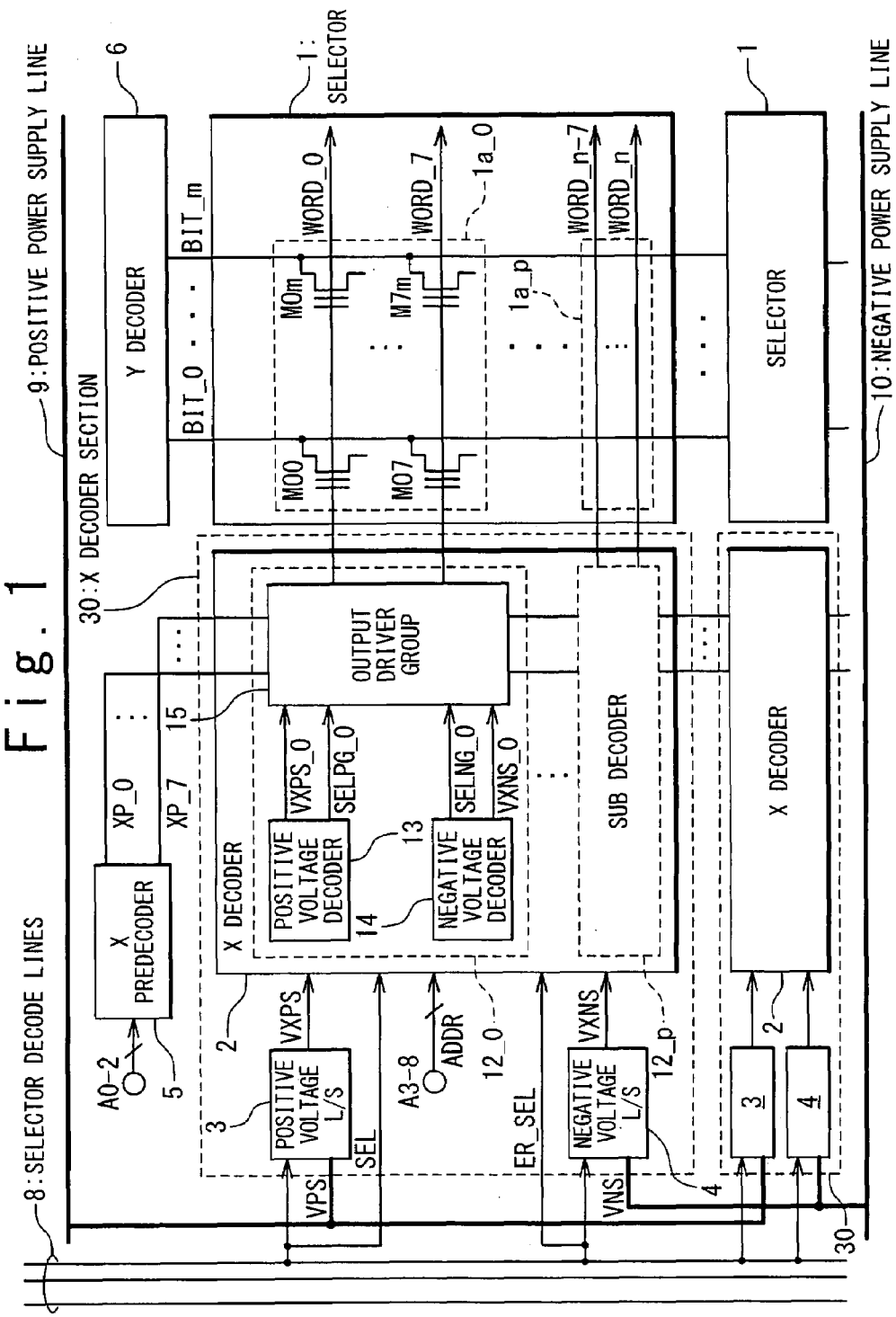
FIG. 1 is a block diagram showing a structure of a nonvolatile semiconductor memory device in the embodiment of the present invention.

FIG. 1 is a block diagram showing a structure of a nonvolatile semiconductor memory device in an embodiment of the present invention. The nonvolatile semiconductor memory device 20 includes a plurality of sectors 1, a plurality of X-decoder sections 30, an X-predecoder 5, a Y-decoder 6, a plurality of sector decode lines 8, a positive power supply line 9, and a negative power supply line 10.

Each of the sectors 1 (memory cell arrays) includes a plurality of bit lines BIT(_0 to m: corresponding to the number of bit lines of a sector 1), a plurality of word lines WORD (_0 to n: corresponding to the number of word lines of a sector 1), a plurality of source lines (not shown), and a plurality of memory cells M(00 to nm: corresponding to the combinations of the numbers 0 to n of the word lines and the numbers 0 to m of the bit lines of a sector 1).

The plurality of bit lines BIT(_0 to m) extends in a Y direction and is connected to the Y-decoder 6. The plurality of word lines WORD(_0 to n) extends in an X direction and is connected to the X-decoder sections 30. The plurality of source lines (not shown) extends in the Y direction. The plurality of memory cells M(00 to nm) is arranged in a matrix form and is provided in correspondence to intersection points of the plurality of bit lines BIT(_0 to m) and the plurality of word lines WORD(_0 to n). The memory cells are NOR-type flash memory cells, of which control gates, drains, and sources are connected to the word lines WORD, the bit lines BIT, and source lines (not shown), respectively.

In addition, each of the sectors 1 includes a plurality of cell groups 1a(_0 to p: corresponding to the number of cell groups 1a of a sector 1), each of which is formed for the given number of word lines WORD. FIG. 1 shows an example where one cell group 1a is formed for eight word lines WORD at the sector 1 at the top.

The Y-decoder 6 is connected to the plurality of bit lines BIT(_0 to m). At the time of data writing (programming), reading, and erasing to the memory cell M, at least one bit line BIT (also referred to as selected bit line hereinafter) is selected from the plurality of bit lines BIT based on an address signal (not shown). At this time, a bit line BIT that is not selected is also referred to as unselected bit line BIT. Then, given voltages are severally applied to the selected bit line BIT and the unselected bit line.

Each of the sector decode lines 8 outputs a sector selection signal SEL for selecting at least one sector 1 from the plurality of sectors 1, to the X-decoder section 30 that corresponds to the sector 1 (mentioned later) at the time of data writing, reading, and erasing to the memory cell M. At the time of erasing, the sector decode line 8 also outputs an erased-sector selection signal ER_SEL for selecting a sector 1 to be erased. The positive power supply line 9 is a line (connection) for supplying positive voltage VPS. The negative power supply line 10 is a line (connection) for supplying negative voltage VNS.

The X-predecoder 5 is connected to an address signal line A0-2 and the plurality of X-decoder sections 30. At the time of data writing, reading, and erasing to the memory cell M, the X-predecoder 5 outputs a word line selection signal XP(_0 to 7 (example): corresponding to the number of word lines of a cell group) for selecting at least one word line WORD (referred to as selected word line hereinafter) from the plurality of word lines WORD within one cell group 1a, to the X-decoder sections 30, based on an address signal of the address signal line A0-2. At this time, a word line WORD that is not selected is also referred to as unselected word line WORD.

Each of the X-decoder sections 30 is severally provided to one sector 1 and is connected to the sector decode line 8, the positive power supply line 9, the negative power supply line 10, an address signal line A3-8, the X-predecoder 5, and a plurality of word lines WORD of a sector 1. Only the X-decoder section 30 at the top is shown in detail in FIG. 1. At the time of data writing, reading, and erasing to the memory cell M, the X-decoder section 30 is supplied with an address signal ADDR of the address signal line A3-8, the sector selection signal SEL, the erased-sector selection signal ER_SEL, the word line selection signals XP(_0 to 7), the positive voltage VPS, and the negative voltage VNS. Based on the foregoing signals and voltages, a selected word line WORD is selected from the plurality of word lines WORD and given voltages are severally applied to the selected word line WORD and unselected word lines WORD of a sector 1. The X-decoder section 30 includes a positive-voltage level shifter 3, a negative-voltage level shifter 4, and an X-decoders 2.

The positive-voltage level shifter 3 is connected to the sector decode line 8, the positive power supply line 9, and the X-decoders 2. Based on the positive voltage VPS, the positive-voltage level shifter 3 level shifts the sector selection signal SEL to a positive voltage signal VXPS and supplies that positive voltage signal VXPS to the X-decoder 2 at the time of data writing, reading, and erasing to the memory cell M.

The negative-voltage level shifter 4 is connected to the sector decode line 8, the negative power supply line 10, and the X-decoders 2. Based on the negative voltage VNS, the negative-voltage level shifter 4 level shifts the erased-sector selection signal ER_SEL to a negative voltage signal VXNS and supplies that negative voltage signal VXNS to the X-decoder 2 at the time of data writing, reading, and erasing to the memory cell M.

One X-decoder 2 is provided to one sector 1 and includes a plurality of sub-decoders 12(_0 to p: corresponding to the number of cell groups 1a), each of which is provided to each cell group 1a. Each of the sub-decoders 12 includes a positive voltage decoder 13, a negative voltage decoder 14, and an output driver group 15. The sub-decoder 12_0 at the top is shown in detail in FIG. 1. The structure concerning the sub-decoder 12_0 is explained below as an example.

The positive voltage decoder 13 is connected to the address signal line A3-8, the positive-voltage level shifter 3, and the output driver group 15. The positive voltage decoder 13 supplies a positive voltage signal VXPS(_0: corresponding to the number of the sub-decoder 12) and a positive-voltage selection signal SELPG(_0: corresponding to the number of the sub-decoder 12) to the output driver group 15 based on the address signal ADDR, the sector selection signal SEL, the erased-sector selection signal ER_SEL, and the positive voltage signal VXPS, at the time of data writing, reading, and erasing to the memory cell M.

The negative voltage decoder 14 is connected to the address signal line A3-8, the negative-voltage level shifter 4, and the output driver group 15. The negative voltage decoder 14 supplies a negative voltage signal VXNS(_0: corresponding to the number of the sub-decoder 12) and a negative-voltage selection signal SELNG(_0: corresponding to the number of the sub-decoder 12) to the output driver group 15 based on the address signal ADDR, the erased-sector selection signal ER_SEL, and the negative voltage signal VXNS, at the time of data writing, reading, and erasing to the memory cell M.

The output driver group 15 is connected to the positive voltage decoder 13, the negative voltage decoder 14, the X-predecoder 5, and a plurality of word lines WORD of a cell group 1a. The output driver group 15 is supplied with the positive voltage signal VXPS(_0) and the positive-voltage selection signal SELPG(_0), the negative voltage signal VXNS(_0) and the negative-voltage selection signal SELNG(_0), and the word line selection signals XP(_0 to 7), at the time of data writing, reading, and erasing to the memory cell M. Based on the foregoing signals, the output driver group 15 selects a selected word line from the plurality of word lines WORD and severally applies given voltages to the selected word line WORD and unselected word line WORD of one cell group 1a.

Figure 2:
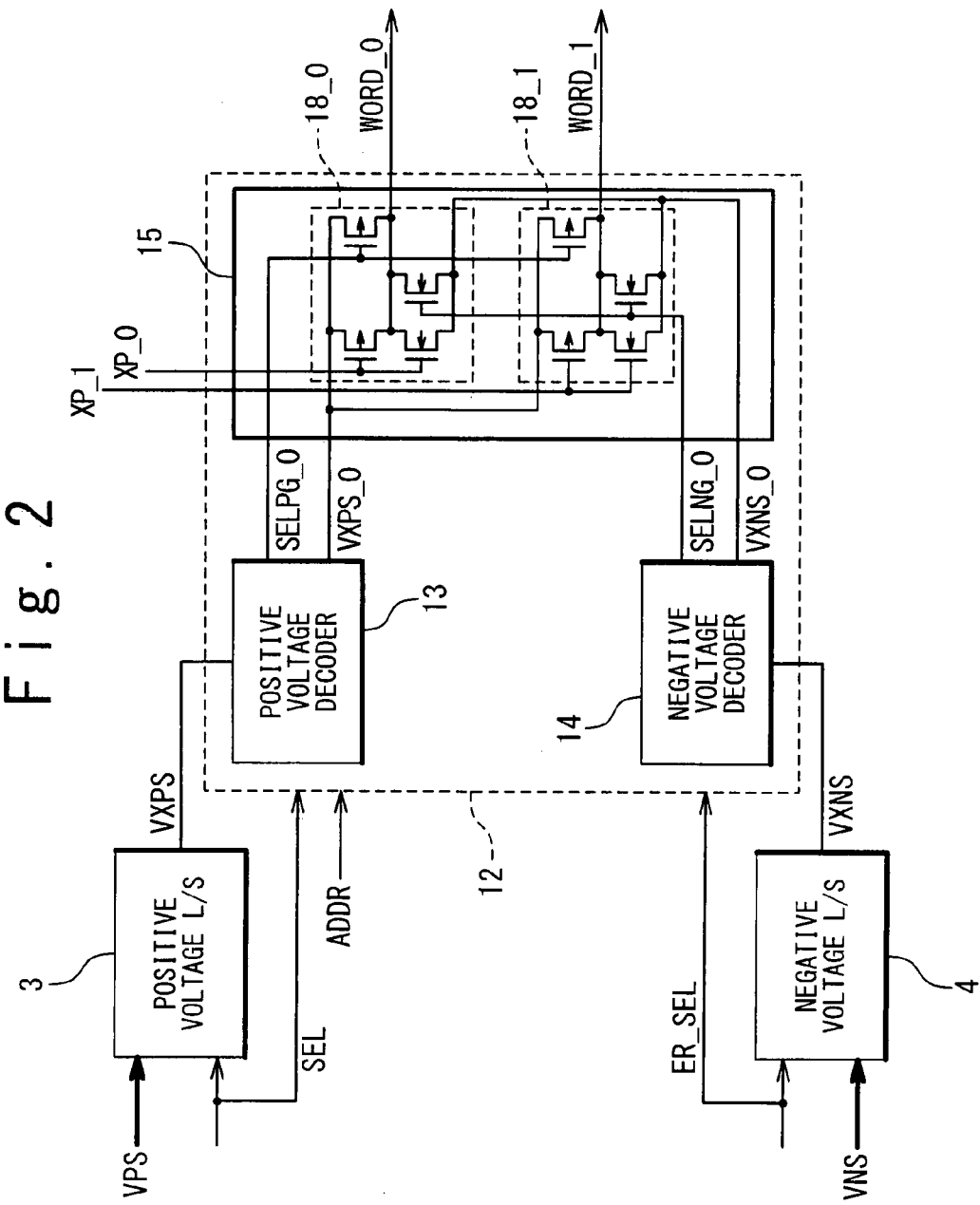
FIG. 2 is a circuit block diagram showing relation between a positive-voltage decoder, a negative-voltage decoder, an output driver group, and word lines.

FIG. 2 is a circuit block diagram showing relation between the positive voltage decoder 13, the negative voltage decoder 14, the output driver group 15, and the word lines WORD. The output driver group 15 includes a plurality of output drivers 18(_0 to 7: 7(example) corresponds to the number of word lines of one cell group 1a), each of which is provided to one word line WORD. For simplification, FIG. 2 only shows the two word lines WORD(_0 and WORD_1 among the plurality of word lines WORD(_0 to 7) and the output drivers 18_0 and 18_1 among the plurality of output drivers 18(_0 to 7). The output drivers 18_0 and 18_1 are connected to the positive voltage decoder 13, the negative voltage decoder 14, the X-predecoder 5, and corresponding word lines WORD.

The output driver 18_0 outputs one of the positive voltage signal VXPS_0 and the negative voltage signal VXNS_0 to the word line WORD_0 based on the positive-voltage selection signal SELPG_0, the negative-voltage selection signal SELNG_0 and the word line selection signal XP_0, at the time of data writing, reading, and erasing to the memory cell M. In the same way, the output driver 18_1 outputs one of the positive voltage signal VXPS_0 and the negative voltage signal VXNS_0 to the word line WORD_1 based on the positive-voltage selection signal SELPG_0, the negative-voltage selection signal SELNG_0 and the word line selection signal XP_1, at the time of data writing, reading, and erasing to the memory cell M.

Figure 3:
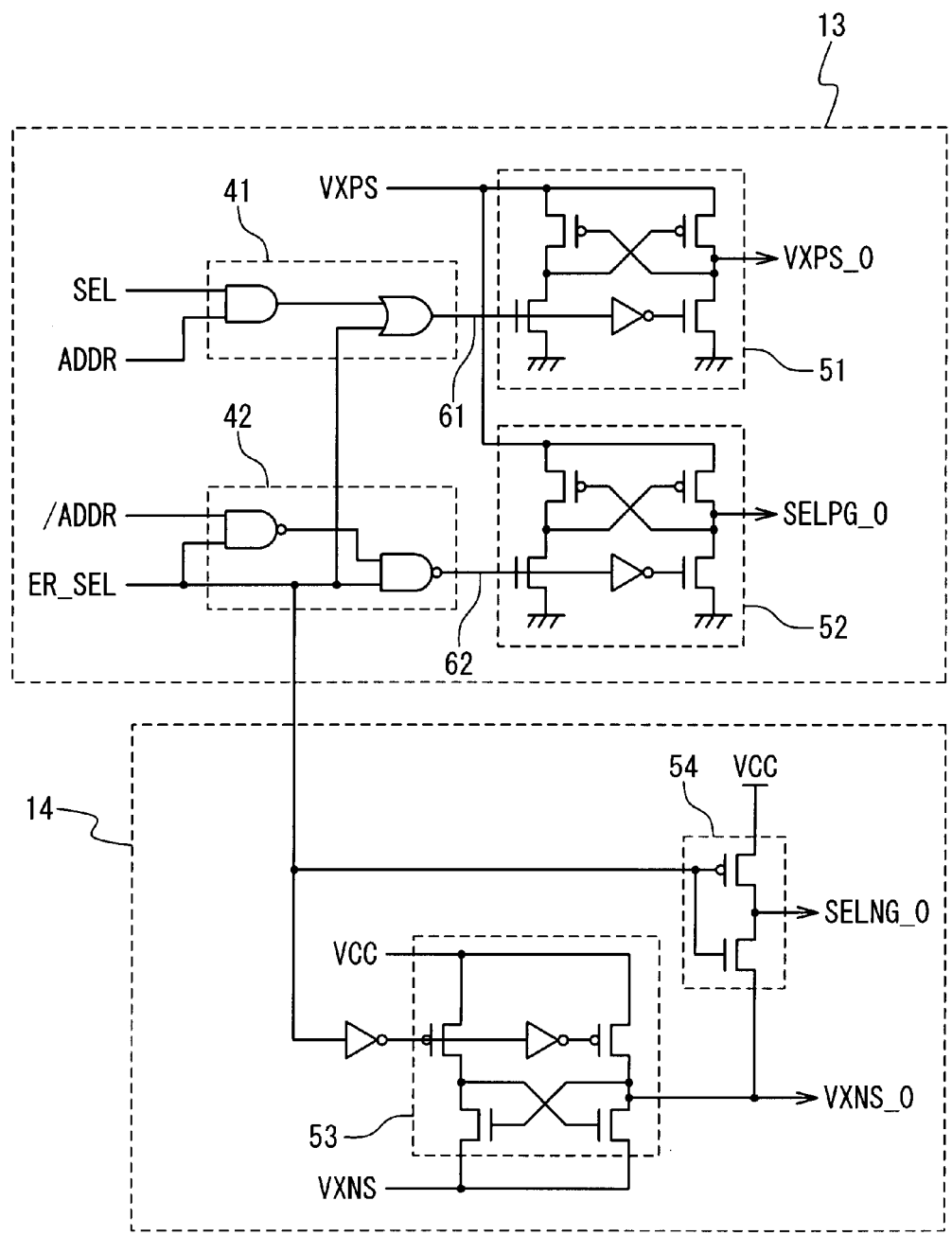
FIG. 3 is a circuit diagram showing an example of structures of the positive-voltage decoder and negative voltage decoder.

FIG. 3 is a circuit diagram showing an example of structures of the positive voltage decoder 13 and the negative voltage decoder 14. The positive voltage decoder 13 includes logic circuits 41 and 42, and level shifters 51 and 52. The logic circuit 41 is supplied with the sector selection signal SEL for selecting the sector 1 to be controlled, the erased-sector selection signal ER_SEL for selecting the sector 1 to be erased, and the address signal ADDR. Then, the logic circuit 41 outputs a control signal 61, which is a result of given logic operation. Based on the positive voltage signal VXPS, the level shifter 51 level-shifts the control signal 61 to the positive voltage signal VXPS_0 and supplies that positive voltage signal VXPS_0 to the group of output drivers 5.

Similarly, the logic circuit 42 is supplied with an inverted address signal /ADDR, which is the address signal ADDR being inverted, from the address signal line A3-8, and the erased-sector selection signal ER_SEL. Then, the logic circuit 42 outputs a control signal 62, which is a result of given logic operation. Based on the positive voltage signal VXPS, the level shifter 52 level-shifts the control signal 62 to the positive-voltage selection signal SELPG_0 and supplies that positive-voltage selection signal SELPG_0 to the group of output drivers 5.

On the other hand, the negative voltage decoder 14 includes level shifters 53 and 54. Based on the negative voltage signal VXNS and power supply voltage VCC, the level shifter 53 level-shifts an inverted erased-sector selection signal /ER_SEL, which is the erased-sector selection signal ER_SEL from the sector decode line 8 being inverted, to the negative voltage signal VXNS_0 and supplies that negative voltage signal VXNS_0 to the group of output drivers 5.

Similarly, based on the negative voltage signal VXNS_0 supplied from the level shifter 53 and power supply voltage VCC, the level shifter 54 level-shifts the erased-sector selection signal ER_SEL to the negative-voltage selection signal SELNG_0 and supplies that negative-voltage selection signal SELNG_0 to the group of output drivers 5.

According to the present invention, the level shifters 51 and 52 of the positive voltage decoder 13 and the level shifters 53 and 54 of the negative voltage decoder 14 are provided to each sub-decoder 12. That is to say, the level shifters 51 to 54 need to correspond only to a plurality of word lines WORD of one cell group, (which is eight in this example, of the word lines WORD_0 to WORD_7). As a result, it is not required to have large current-supply capacity since it is just necessary to drive the small number of drivers 18(_0 to 7). In other words, power consumption is low.

Figure 4:
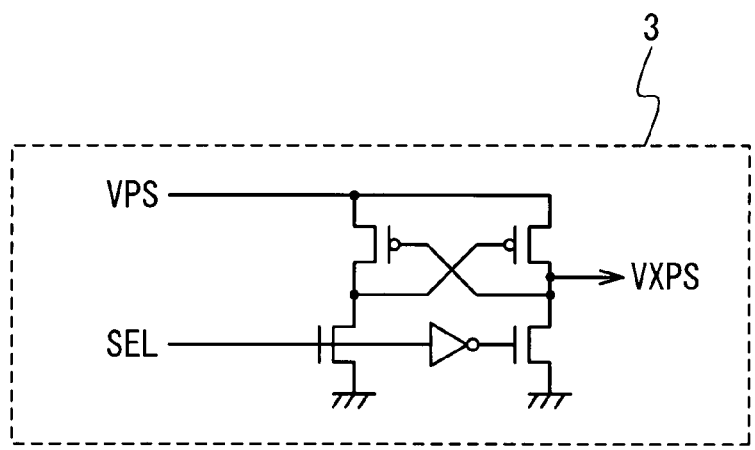
FIG. 4 is a circuit diagram showing an example of a structure of a positive-voltage level shifter.

FIG. 4 is a circuit diagram showing an example of the structure of the positive-voltage level shifter 3. The positive-voltage level shifter 3 level-shifts the sector selection signal SEL to the positive voltage signal VXPS based on the positive voltage VPS, and supplies that positive voltage signal VXPS to the positive voltage decoder 13, at the time of data writing, reading, and erasing to the memory cell M.

Figure 5:
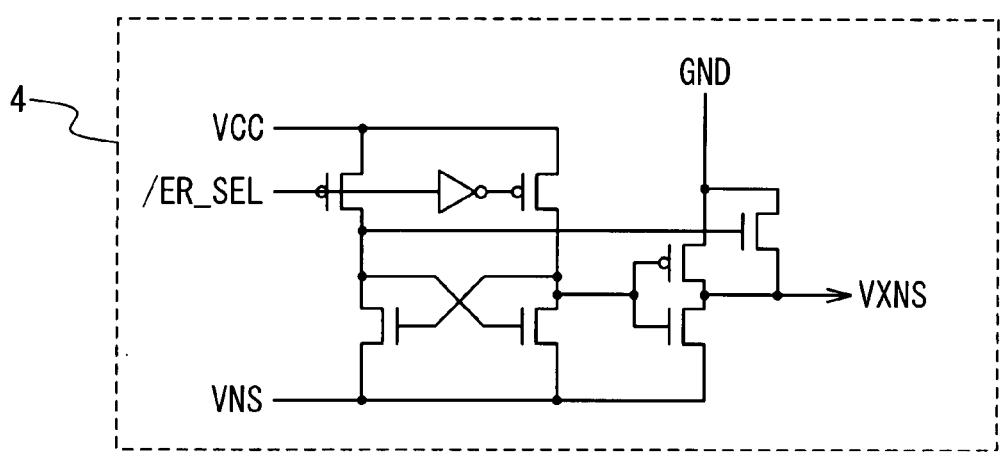
FIG. 5 is a circuit diagram showing an example of a structure of a negative-voltage level shifter.

FIG. 5 is a circuit diagram showing an example of the structure of the negative-voltage level shifter 4. The negative-voltage level shifter 4 level-shifts the inverted erased-sector selection signal /ER_SEL, which is the erased sector selection signal ER_SEL from the sector decode line 8 being inverted, to the negative voltage signal VXNS based on the negative voltage VNS and power supply voltage VCC, and supplies that negative voltage signal VXNS to the negative voltage decoder 14, at the time of data writing, reading, and erasing to the memory cell M.

The positive-voltage level shifter 3 and the negative-voltage level shifter 4 are provided to each X-decoder 2. That is to say, since each positive-voltage level shifter 3 and negative-voltage level shifter 4 just need to correspond to the positive voltage decoder 13 and negative voltage decoder 14 of one X-decoder 2, (which in this example, is (p+1) of the sub-decoders 12_0 to 12_p of the X-decoder 2, where p is 63 for example), it is required to have only small current-supply capacity. In other words, power consumption is low.

Figure 6:
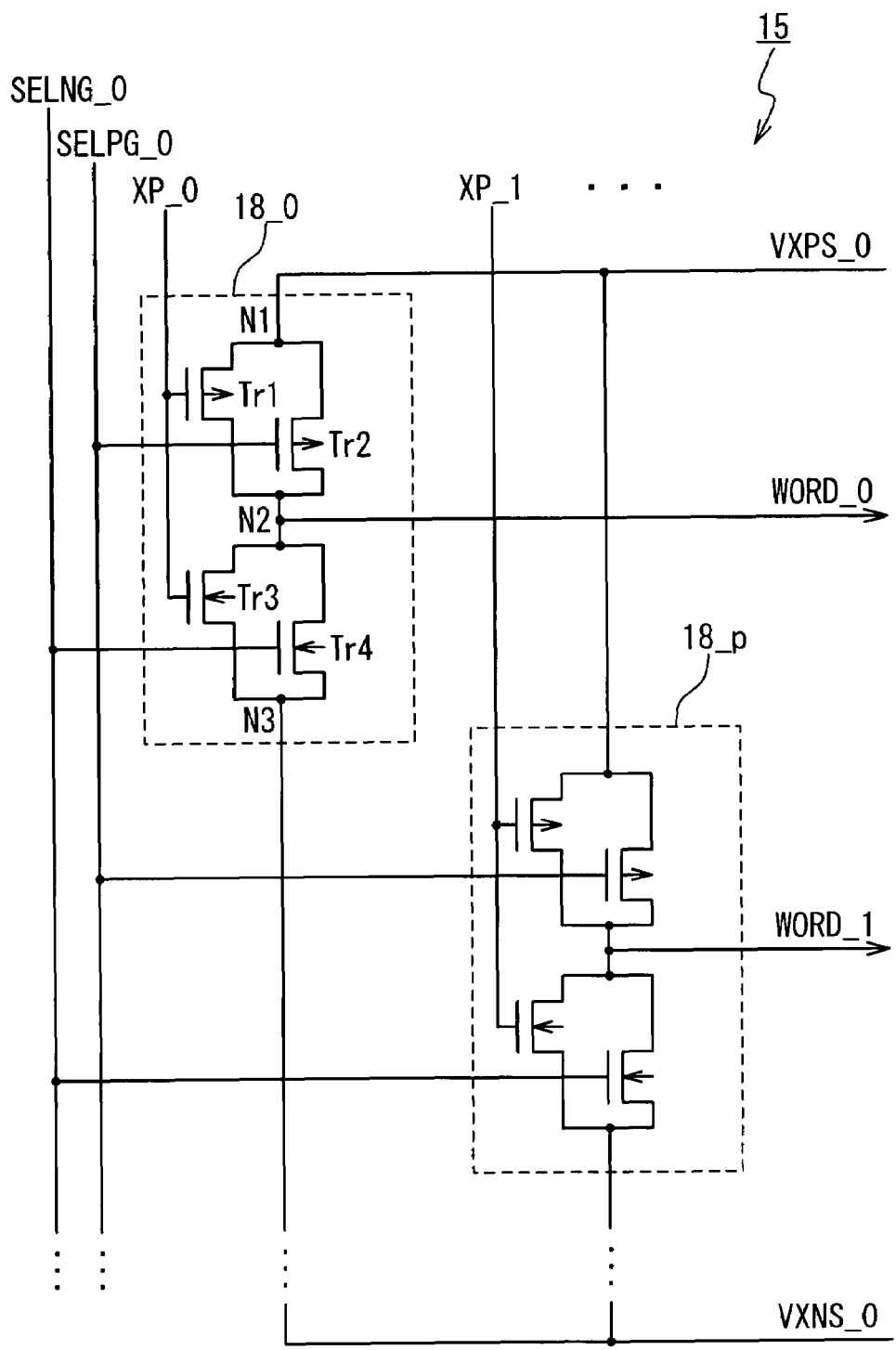
FIG. 6 is a circuit diagram showing details of each output driver.

FIG. 6 is a circuit diagram showing details of each output driver 18. Here, the output drivers 18_0 and 18_1 are shown as an example. The output driver 18_0 includes transistors Tr1, Tr2, Tr3, and Tr4. The transistor Tr1 is P-type, of which gate is supplied with the word line selection signal XP_0 and of which one and the other terminals are connected to first and second nodes N1 and N2 respectively. The transistor Tr2 is the P-type, of which gate is supplied with the positive-voltage selection signal SELPG_0 and of which one and the other terminals are connected to the first and second nodes N1 and N2 respectively. The transistor Tr3 is N-type, of which gate is supplied with the word line selection signal XP_0 and of which one and the other terminals are connected to the second node N2 and a third node N3 respectively. The transistor Tr4 is the N-type, of which gate is supplied with the negative-voltage selection signal SELNG_0 and of which one and the other terminals are connected to the second and third nodes N2 and N3 respectively. The first node N1 is supplied with the positive voltage signal VXPS_0. The third node N3 is supplied with the negative voltage signal VXNS_0. The second node N2 is connected to the corresponding word line WORD_0 among the plurality of word lines WORD. The output drivers 18 are connected with each other in parallel between a line for supplying the positive voltage signal VXPS_0 and a line for supplying the negative voltage signal VXNS_0.

The output driver 18_0 can definitely supply and intercept the positive voltage signal VXPS_0 to the word line WORD_0 by the two P-type transistors Tr1 and Tr2. Similarly, the output driver 18_0 can definitely supply and intercept the negative voltage signal VXNS_0 to the word line WORD_0 by the two N-type transistors Tr3 and Tr4. According to the present invention, negative voltage is supplied to a word line where erasing is performed while positive voltage is supplied to the remaining word lines. In that case, the above structure of the output driver 18 makes it possible to definitely supply and intercept given voltages (the positive voltage signal VXPS_0 and the negative voltage signal VXNS_0) to each word line. As a result, it is possible to improve reliability of an erase operation of each word line at the time of erasing.

FIG. 7 is a table showing an example of a voltage of each signal at the time of a read operation in the nonvolatile semiconductor memory device of the present invention. FIG. 7 shows the example where the word line WORD_0 is selected and a read operation is performed thereto. Here, operations involving the bit line BIT are omitted. In the table, "selected sector" shows a sector 1 for operation among the plurality of sectors 1. "Within selected Xmain" shows a cell group 1a for operation among the plurality of cell groups 1a in the selected sector 1. "Within unselected Xmain" shows a cell group 1a not for operation among the plurality of cell groups 1a in the selected sector 1. "Unselected sector" shows a sector 1 not for operation among the plurality of sectors 1. In this table, the two word lines WORD_0 and WORD_1 are taken as examples.

At "within selected Xmain" and "within unselected Xmain" of "selected sector" and at "unselected sector", the positive supply voltage VPS is 6 V, 6 V, and 6 V, the negative supply voltage VNS is 0 V, 0 V, and 0 V, the positive voltage signal VXPS is 6 V, 6 V, and 0 V, the negative voltage signal VXNS is 0 V, 0 V, and 0 V, the positive voltage signal VXPS_0 is 6 V, 0 V, and 0 V, the negative voltage signal VXNS_0 is 0 V, 0 V, and 0 V, the positive-voltage selection signal SELPG_0 is 6 V, 6 V, and 6 V, the negative-voltage selection signal SELNG_0 is 0 V, VCC, and VCC, the word line selection signal XP_0 is 0 V, 0 V, and 0 V, the word line selection signal XP_1 (to XP_7) is 6 V, 6 V, and 6 V, the sector selection signal SEL is H, H, and L, the address signal ADDR is H, L, and L, and the erased-sector selection signal ER_SEL is L, L, and L, respectively.

Consequently, 6 V is applied to the selected word line WORD_0 of the targeted cell group 1a. 1 V and 0 V are applied to corresponding bit line BIT and source line, respectively. 0 V is applied to the unselected word lines WORD_2 to WORD_7 of the targeted cell group 1a and word lines WORD of the untargeted cell group 1a and unselected sector 1. 0 V and 0 V are applied to corresponding bit lines BIT and source lines, respectively. With the above voltage application, data is read from a desired memory cell.

FIG. 8 is a table showing an example of a voltage of each signal at the time of a write (program) operation in the nonvolatile semiconductor memory device of the present invention. FIG. 8 shows the example where the word line WORD_0 is selected and a write operation is performed thereto. Here, operations involving the bit line BIT are omitted. "Selected sector", "within selected Xmain", "within unselected Xmain", and "unselected sector" are the same as in the case of FIG. 7. In this table, the two word lines WORD_0 and WORD_1 are taken as examples.

At "within selected Xmain" and "within unselected Xmain" of "selected sector" and at "unselected sector", the positive supply voltage VPS is 10 V, 10 V, and 10 V, the negative supply voltage VNS is 0 V, 0 V, and 0 V, the positive voltage signal VXPS is 10 V, 10 V, and 0 V, the negative voltage signal VXNS is 0 V, 0 V, and 0 V, the positive voltage signal VXPS_0 is 10 V, 0 V, and 0 V, the negative voltage signal VXNS_0 is 0 V, 0 V, and 0 V, the positive-voltage selection signal SELPG_0 is 10 V, 10 V, and 10 V, the negative-voltage selection signal SELNG_0 is 0 V, VCC, and VCC, the word line selection signal XP_0 is 0 V, 0 V, and 0 V, the word line selection signal XP_1 (to XP_7) is 10 V, 10 V, and 10 V, the sector selection signal SEL is H, H, and L, the address signal ADDR is H, L, and L, and the erased-sector selection signal ER_SEL is L, L, and L, respectively.

Consequently, 10 V is applied to the selected word line WORD_0 of the targeted cell group 1a. 6 V and 0 V are applied to corresponding bit line BIT and source line, respectively. 0 V is applied to the unselected word lines WORD_2 to WORD_7 of the targeted cell group 1a and word lines WORD of the untargeted cell group 1a and unselected sector 1. 0 V and 0 V are applied to corresponding bit line BIT and source line respectively. With the above voltage application, data is written (programmed) to a desired memory cell.

FIG. 9 is a table showing an example of a voltage of each signal at the time of an erase operation in the nonvolatile semiconductor memory device of the present invention. FIG. 9 shows the example where the word line WORD_0 is selected and an erase operation is performed thereto. Here, operations involving the bit line BIT are omitted. "Selected sector", "within selected Xmain", "within unselected Xmain", and "unselected sector" are the same as in the case of FIG. 7. In this table, the two word lines WORD_0 and WORD_1 are taken as examples.

At "within selected Xmain" and "within unselected Xmain" of "selected sector" and at "unselected sector", the positive supply voltage VPS is VCC, VCC, and VCC, the negative supply voltage VNS is −10 V, −10 V, and −10 V, the positive voltage signal VXPS is VCC, VCC, and 0 V, the negative voltage signal VXNS is −10 V, −10 V, and 0 V, the positive voltage signal VXPS_0 is VCC, VCC, and 0 V, the negative voltage signal VXNS_0 is −10 V, VCC, and 0 V, the positive-voltage selection signal SELPG_0 is VCC, 0 V, and VCC, the negative-voltage selection signal SELNG_0 is −10 V, −10 V, and VCC, the word line selection signal XP_0 is VCC, VCC, and VCC, the word line selection signal XP_1 (to XP_7) is −10 V, −10 V, and −10 V, the sector selection signal SEL is H, H, and L, the address signal ADDR is H, L, and L, and the erased-sector selection signal ER_SEL is H, H, and L, respectively.

Consequently, −10 V is applied to the selected word line WORD_0 of the targeted cell group 1*a*. The corresponding bit line BIT is open while 5 V is applied to the corresponding source line. VCC is applied to the unselected word lines WORD_2 to WORD_7 of the targeted cell group 1*a* and word lines WORD of the untargeted cell group 1*a*. The corresponding bit line BIT and source line are open. Additionally, 0 V is applied to the word lines WORD of the unselected sector 1. The corresponding bit line BIT and source line are open. 9 V is applied as a substrate voltage. With the above voltage application, data of a desired memory cell is erased.

It is preferable that the VCC (positive voltage) applied to the unselected word lines WORD_2 to WORD_7 of the targeted cell group 1*a* and the word lines WORD of the untargeted cell group 1*a* is set such that, for example, FN tunnel current in this case is smaller by one figure or more than that in the case using ground potential. In this case, the VCC (positive voltage) is approximately 1 V, which depends on a structure of a memory cell and so forth. It is further preferable that the VCC (positive voltage) is selected such that the FN tunnel current in this case is smaller by two or more figures that that in the case using the ground potential. In this case, the VCC (positive voltage) is approximately 2 V, which depends on a structure of a memory cell and so forth.

Next, an embodiment of an operation of the nonvolatile semiconductor memory device (an embodiment of the method of operating the nonvolatile semiconductor memory device) according to the present invention will be described below. Here, an erase operation is explained.

First, collective writing is performed to all the memory cells M00 to Mnm included in the sector 1 to be erased. Next, data erasing, erase-verify, and rewriting of the memory cell M are performed to each word line in order, with regard to the memory cells on each of the word lines WORD_0 to WORD_n of the sector 1.

For instance, erasing, erase-verify, and rewriting are firstly performed to the memory cells M00 to M0*m* on the WORD_0; erasing, erase-verify, and rewriting are secondly performed to the memory cells M10 to M1*m* on the WORD_1; and the same applies to the remaining, where erasing, erase-verify, and rewriting are lastly performed to the memory cells Mn0 to Mnm on the WORD_n. The operations of data erasing, erase-verify, and rewriting are performed to memory cells on each word line in totally the same way. For this reason, explanation is given only to an erase operation involving the memory cells M00 to M0*m* on the word line WORD_0 of the sector 1.

First, concerning the sector 1 to be erased, address signals related to the memory cells M00 to M0*m* on the word line WORD_0 to which erasing is performed, are generated by a control section (not shown). After that, part of the address signals is supplied to the X-predecoder 5 through the address signal line A0-2. Another part of the address signals is supplied to the X-decoder section 30 through the address signal line A3-8. Still another part of the address signals is supplied as the sector selection signal SEL and the erased-sector selection signal ER_SEL, to the X-decoder section 30 through the sector decode line 8. Still another part of the address signals is supplied to the Y-decoder 6. The Y-decoder 6 selects the bit lines BIT_0 to BIT_m.

The positive-voltage level shifter 3 supplies the positive voltage signal VXPS that is the sector selection signal SEL of the sector decode line 8 being level-shifted, to the positive voltage decoder 13 based on the positive voltage VPS supplied from the positive power supply line 9. The negative-voltage level shifter 4 supplies the negative voltage signal VXNS that is an inverted erased-sector selection signal /ER_SEL of the sector decode line 8 being level-shifted, to the negative voltage decoder 14 based on the negative voltage VNS supplied from the negative power supply line 10.

The positive voltage decoder 13 supplies the positive voltage signal VXPS_0 and the positive-voltage selection signal SELPG_0 to the output driver group 15 based on the address signal ADDR of the address signal line A3-8, the sector selection signal SEL and erased-sector selection signal ER_SEL of the sector decode line 8, and the positive voltage signal VXPS of the positive-voltage level shifter 3. The negative voltage decoder 14 supplies the negative voltage signal VXNS_0 and the negative-voltage selection signal SELNG_0 to the output driver group 15 based on the address signal ADDR of the address signal line A3-8, the erased-sector selection signal ER_SEL of the sector decode line 8, and the negative voltage signal VXNS of the negative-voltage level shifter 4.

The output driver 18_0 outputs the negative voltage signal VXNS_0 to the word line WORD_0 based on the positive-voltage selection signal SELPG_0, the negative-voltage selection signal SELNG_0, and the word line selection signal XP_0 of the X-predecoder 5. The output drivers 18_1 to 18_7 output the positive voltage signal VXPS_0 to the word lines WORD_1 to WORD_7 respectively, based on the positive-voltage selection signal SELPG_0, the negative-voltage selection signal SELNG_0, and the word line selection signals XP_1 to XP_7 of the X-predecoder 5. At this time, substrate voltage (e.g. 9 V) is applied to a substrate.

At this time, generated voltages supplied to each structure are as shown in FIG. 9, concerning other cell groups 1*a* of the sector 1 to be erased and other unselected sectors 1. All but the difference in voltages are the same as the above operations, and so the explanation of the other cell groups 1*a* of the sector 1 to be erased and the other unselected sectors 1 is not given.

Subsequently, the process of erase-verify is performed to the memory cells M00 to M0*m* on the word line WORD_0 in order to judge whether the memory cell M where over-erasing is caused is present or not. Rewriting is performed to the memory cell M where over-erasing is caused.

As a result of the above process, erasing concerning the memory cells M00 to M0*m* on the word line WORD_0 is completed. After that, data erasing, erase-verify, and rewriting of the memory cell M are performed in the same way to each word line in order with regard to the memory cell M on all the word lines WORD_0 to WORD_n of the sector 1 to be erased, as mentioned above. Consequently, erasing of all the memory cells M in the sector 1 to be erased is completed.

Additionally, collective writing in the erasing process may also be performed in units of a word line with regard to the sector 1 to be erased. In other words, it is possible to perform writing, erasing, erase-verify, and rewriting in units of a word line. In that case, the erasing process can be performed more accurately since a range of variations in threshold values due to writing can be kept narrow.

According to the present invention, an erase operation is performed in units of not a sector but a word line in a sector. This makes it possible to reduce the number (population parameter) of memory cells to be erased at one erase operation, resulting in narrower distribution of threshold voltages at the memory cells M in the sector 1. In other words, a range of variations in threshold voltages can be kept narrow. In addition, it is possible to accurately perform erase-verify since an over-erased memory cell is no longer present on the same bit line as a result of performing erasing and erase-verify in units of a word line after collective writing, or performing writing in units of a word line before performing erasing and erase-verify.

Figure 10:
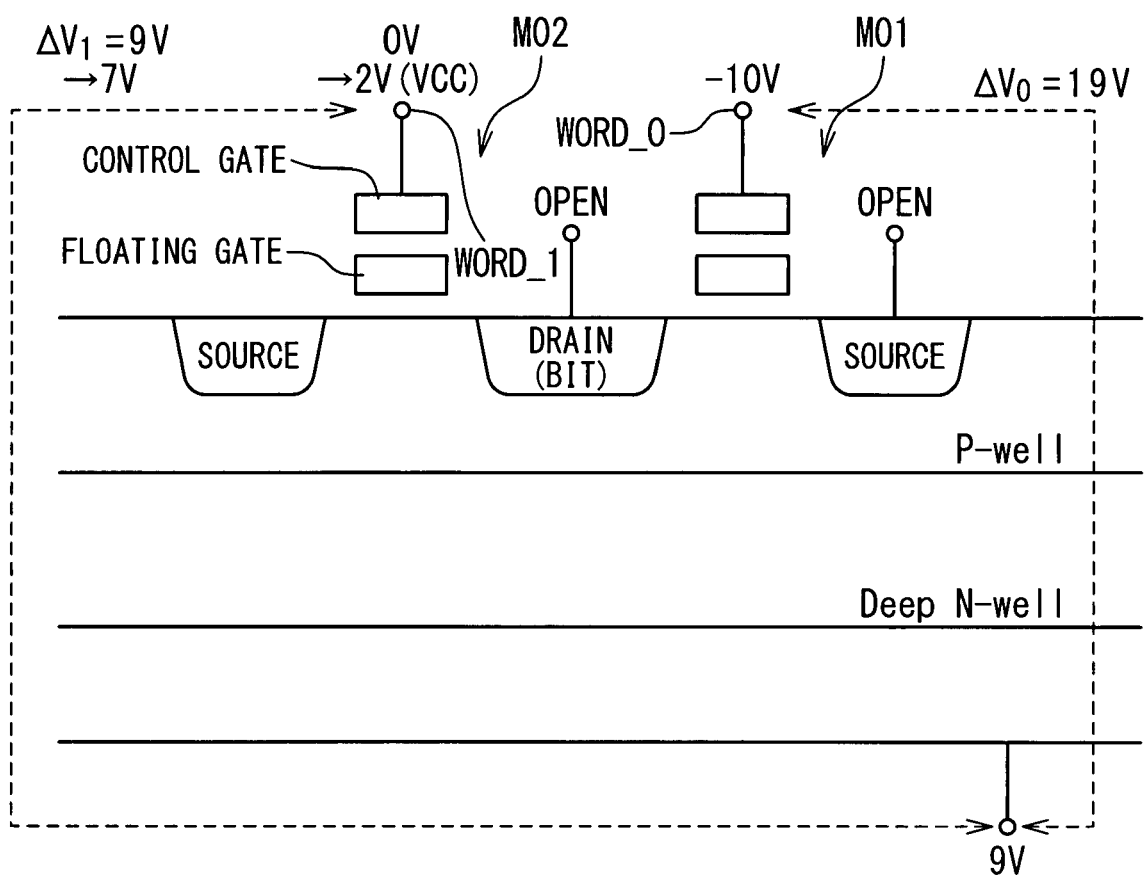
FIG. 10 is a sectional view for explaining the effect of the present invention.

According to the present invention, negative voltage (e.g. −10 V) is applied to a selected word line and positive voltage (e.g. VCC) is applied to unselected word lines in the same sector 1 when an erase operation is performed in units of a word line. FIG. 10 is a sectional view for explaining another effect of the present invention. Here, explanation is given with the memory cells M01 and M02 as the stack-gate type memory cells for example. When the memory cell M01 on the selected word line WORD_0 is erased, erasing is performed by applying positive voltage (e.g. 9 V) to the substrate in order to apply a voltage difference $\Delta V0=(9\,V-(-10\,V)=)19\,V$ to the memory cell M01, which causes electrons being drawn out as FN (Fowler-Nordheim) tunnel current from a floating gate. At this time, the positive voltage (e.g. 9 V) applied to the substrate is applied to adjacent unselected word lines as well. In the related art case, since the unselected word line WORD_1 is grounded, a voltage difference $\Delta V1=(9\,V-(0\,V)=)\,9\,V$ being applied to the memory cell M02 on the unselected word line WORD_1. The volume of $\Delta V1$ may cause FN tunnel current, considering variations in memory cells.

According to the present invention however, positive voltage (e.g. VCC=2 V) is applied to unselected word lines (e.g. WORD_1). Therefore, a voltage difference $\Delta V1=(9\,V-(2\,V)=)7\,V$ is applied to the memory cell M02 on the unselected word line WORD_1. Since the volume of the FN tunnel current exponentially changes against a voltage difference, it is possible to reduce the possibility of causing FN tunnel current to an ignorable extent as a result of $\Delta V1$ being reduced by a value of positive voltage (e.g. VCC=2 V). As mentioned above, the positive voltage is set such that FN tunnel current in this case is smaller by one figure or more, or more preferably two or more figures, than that in the case of ground potential, for example. Consequently, it is possible to prevent electrons from being drawn out from a memory cell on an unselected word line and erasing, in the case where negative voltage and positive voltage are applied to a selected word line and an unselected word line respectively and positive voltage is applied as a substrate voltage when an erase operation is performed. Additionally, it is possible to more appropriately control variations in threshold voltages at memory cells at the time of erasing.

According to the present invention, it is possible to control variations in threshold voltages at memory cells at the time of erasing more appropriately and precisely without adversely affecting memory cells on unselected word lines, responding to the miniaturization of memory cells.

It is apparent that the present invention is not limited to the above embodiments, but may be modified and changed without departing from the scope and spirit of the invention.

What is claimed is:

1. A nonvolatile semiconductor memory device comprising:
   a memory array configured to include a plurality of nonvolatile memory cells arranged in a matrix form and a plurality of word lines; and
   an X-decode section configured to select a selected word line selected from said plurality of word lines, supply a negative voltage to said selected word line, and supply a positive voltage to unselected word lines which are not said selected word line, at the time of an erase operation,
   wherein said X-decode section includes:
   a plurality of output drivers configured to be provided corresponding to said plurality of word lines, each of said plurality of output drivers outputs at least one of said negative voltage and said positive voltage,
   a negative voltage decoder configured to supply said negative voltage to said plurality of output drivers, and
   a positive voltage decoder configured to supply said positive voltage to said plurality of output drivers,
   wherein each of said plurality of output drivers, based on a word line selection signal for selecting one of said plurality of word lines and a voltage selection signal for selecting one of said negative voltage and said positive voltage, supplies voltage corresponding to said voltage selection signal to corresponding one of said plurality of word lines,
   wherein said voltage selection signal includes a negative-voltage selection signal for selecting said negative voltage and a positive-voltage selection signal for selecting said positive voltage,
   wherein said each of the plurality of output drivers includes:
   a first transistor configured to receive said word line selection signal at a gate, be connected to a first node at one terminal and a second node at another terminal, and be a first conductive type,
   a second transistor configured to receive said positive-voltage selection signal at a gate, be connected to said first node at one terminal and said second node at another terminal, and be said first conductive type,
   a third transistor configured to receive said word line selection signal at a gate, be connected to said second node at one terminal and a third node at another terminal, and be a second conductive type, and
   a fourth transistor configured to receive said negative-voltage selection signal at a gate, be connected to said second node at one terminal and said third node at another terminal, and be said second conductive type,
   wherein said first node receives said positive voltage,
   said third node receives said negative voltage, and
   said second node is connected to corresponding one of said plurality of word lines.

2. The nonvolatile semiconductor memory device according to claim 1, further comprising:
   a X-predecoder configured to output said word line selection signal based on a first address signal,
   wherein said negative voltage decoder outputs said negative-voltage selection signal based on a second address signal and
   said positive voltage decoder outputs said positive-voltage selection signal based on said second address signal.

3. The nonvolatile semiconductor memory device according to claim 2, wherein said X-decode section further includes:
   a negative-voltage level shifter configured to supply said negative voltage to said negative voltage decoder, and
   a positive-voltage level shifter configured to supply said positive voltage to said positive voltage decoder.

4. The nonvolatile semiconductor memory device according to claim 3, wherein said plurality of nonvolatile memory cells is separated to a plurality of sectors, and
   said negative-voltage level shifter and said positive-voltage level shifter are provided every one of plurality of sectors.

5. The nonvolatile semiconductor memory device according to claim 3, wherein said plurality of nonvolatile memory cells is separated to a plurality of cell groups, and
   said negative voltage decoder and said positive voltage decoder are provided every one of plurality of cell groups.

6. A method of operating the nonvolatile semiconductor memory device, comprising:
- (a) selecting a selected word line from a plurality of word lines, at the time of an erase operation in a memory array including said plurality of nonvolatile memory cells arranged in a matrix form and a plurality of word lines; and
- (b) supplying a negative voltage to said selected word line, and supplying a positive voltage to unselected word lines which are not said selected word line, wherein said step (a) includes:
- (a1) selecting said selected word line, based on a word line selection signal for selecting one of said plurality of word lines, wherein said step (b) includes:
- (b1) supplying said negative voltage to said selected word line based on a negative-voltage selection signal for selecting said negative voltage, and supplying said positive voltage to said unselected word lines based on a positive-voltage selection signal for selecting said positive voltage, wherein said step (a1) includes:
- (a11) supplying said word line selection signal to gates of a first transistor with a first conductive type and a third transistor with a second conductive type, wherein said step (b1) includes:
- (b11) supplying said positive-voltage selection signal to a gate of a second transistor with said first conductive type, and supplying said negative-voltage selection signal to a gate of a fourth transistor with said second conductive type, wherein said first transistor is connected to a first node at one terminal and a second node at another terminal,
said second transistor is connected to said first node at one terminal and said second node at another terminal,
said third transistor is connected to said second node at one terminal and a third node at another terminal, and
said fourth transistor is connected to said second node at one terminal and said third node at another terminal,
wherein said first node receives said positive voltage,
said third node receives said negative voltage, and
said second node is connected to said selected word lines.

7. The method of operating the nonvolatile semiconductor memory device according to claim 6, wherein said step (a11) includes:
- (a111) outputting said word line selection signal based on a first address signal, wherein said step (b11) includes:
- (b111) outputting said negative-voltage selection signal based on a second address signal, and outputting said positive-voltage selection signal based on said second address signal.

8. The method of operating the nonvolatile semiconductor memory device according to claim 6, wherein said step (b1) includes:
- (b12) supplying said negative voltage from a negative-voltage level shifter to said third node, and
- (b13) supplying said positive voltage from a positive-voltage level shifter to said first node.

* * * * *